(12) United States Patent
Ide et al.

(10) Patent No.: US 7,643,261 B2
(45) Date of Patent: Jan. 5, 2010

(54) SEMICONDUCTOR DEVICE

(75) Inventors: Hiroshi Ide, Tokyo (JP); Satoshi Fujita, Tokyo (JP); Takehiko Umeyama, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 324 days.

(21) Appl. No.: 11/616,494

(22) Filed: Dec. 27, 2006

(65) Prior Publication Data

US 2007/0177328 A1 Aug. 2, 2007

(30) Foreign Application Priority Data

Jan. 13, 2006 (JP) ............................. 2006-005514

(51) Int. Cl.
*H02H 9/00* (2006.01)
(52) U.S. Cl. ........................................................ 361/56
(58) Field of Classification Search ................. 361/56
See application file for complete search history.

(56) References Cited

U.S. PATENT DOCUMENTS

| | | | | |
|---|---|---|---|---|
| 5,530,612 | A * | 6/1996 | Maloney | 361/56 |
| 5,945,713 | A * | 8/1999 | Voldman | 257/355 |
| 6,549,149 | B2 * | 4/2003 | Aue | 341/118 |
| 6,624,998 | B2 * | 9/2003 | May et al. | 361/111 |
| 7,110,329 | B2 * | 9/2006 | Kaji | 369/30.11 |
| 7,136,340 | B2 * | 11/2006 | Ide et al. | 369/53.34 |
| 7,205,817 | B1 * | 4/2007 | Huang et al. | 327/308 |
| 7,233,736 | B2 * | 6/2007 | Aridome et al. | 386/131 |
| 7,430,157 | B2 * | 9/2008 | Nishino et al. | 369/53.24 |
| 2004/0188761 | A1 * | 9/2004 | Koyama | 257/348 |
| 2005/0162990 | A1 * | 7/2005 | Murata | 369/30.23 |
| 2006/0062111 | A1 * | 3/2006 | Yoshioka | 369/47.1 |
| 2006/0162463 | A1 * | 7/2006 | Kawano | 73/794 |

FOREIGN PATENT DOCUMENTS

| | | |
|---|---|---|
| JP | 5-327460 | 12/1993 |
| JP | 10-145219 | 5/1998 |

* cited by examiner

*Primary Examiner*—Robert DeBeradinis
*Assistant Examiner*—Scott Bauer
(74) *Attorney, Agent, or Firm*—Mattingly & Malur, PC

(57) ABSTRACT

There is provided a semiconductor device capable of supplying an analog input signal higher than or equal to an operating power supply voltage. An electrostatic discharge protection circuit corresponding to the analog input signal is provided for an external terminal that is supplied with an analog input signal generated with a first power supply voltage. A voltage divider resistor divides the analog input signal passing through the electrostatic discharge protection circuit into a voltage corresponding to a second power supply voltage lower that the first power supply voltage. An input circuit operating on the second power supply voltage receives the analog input signal divided by the voltage divider resistor to form an internal analog signal. There are provided first and second unidirectional elements. The first unidirectional element passes current from the input circuit's input terminal to the second power supply voltage. The second unidirectional element passes current from a circuit ground potential to a first circuit's input terminal.

9 Claims, 16 Drawing Sheets

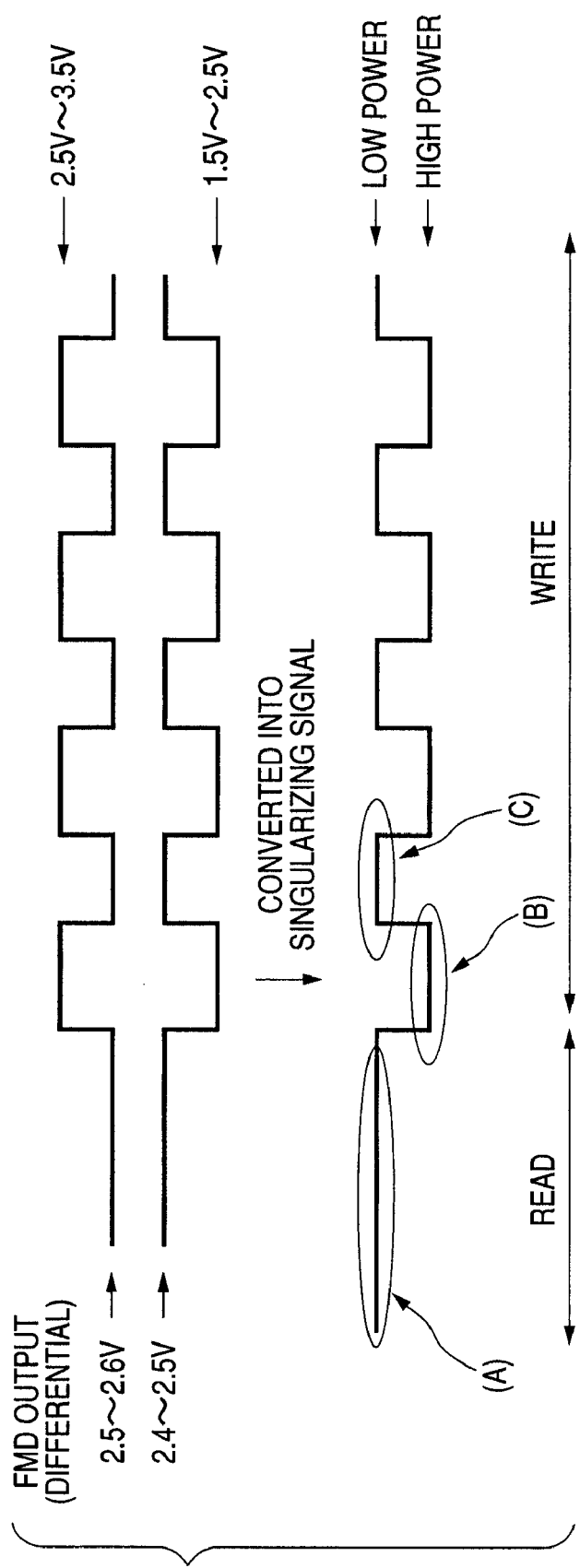

SEMICONDUCTOR DEVICE

CROSS-REFERENCE TO RELATED APPLICATION

The present application claims priority from Japanese patent application No. 2006-5514 filed on Jan. 13, 2006, the content of which is hereby incorporated by reference into this application.

BACKGROUND OF THE INVENTION

The present invention relates to a semiconductor device. More specifically, the invention relates to a technology effectively applicable to a DVD signal processing-oriented semiconductor integrated circuit provided with an optical pickup interface for DVD (digital video disk).

According to the example described in Japanese Unexamined Patent Publication No. Hei 5(1993)-327460, the resistor provided to the input protection circuit is used for voltage conversion by dividing different voltage signal levels in semiconductor integrated circuits such as LSI having different operating voltages. Japanese Unexamined Patent Publication No. Hei 10(1998)-145219 discloses the semiconductor input circuit that performs capacity division and coupling to divide and input a voltage amplitude of a logic signal supplied from the outside.

Patent document 1: Japanese Unexamined Patent Publication No. Hei 5(1993)-327460

Patent document 2: Japanese Unexamined Patent Publication No. Hei 10(1998)-145219

SUMMARY OF THE INVENTION

An integrated circuit for DVD-write optical pickups operates on a power supply voltage of 5 V. By contrast, a semiconductor integrated circuit such as DSP for signal processing operates on low voltages such as 3.3 V and 1.5 V. A conventional DVD system uses an analog front-end that operates on 5 V power supply voltage. The analog front-end performs level conversion of an output signal from an optical pickup integrated circuit into a low voltage such as 3.3 V or 1.5 V as mentioned above. The level-converted signal is transmitted to a signal processing integrated circuit such as DSP. The inventors of this application considered whether to mount the analog front-end on a signal processing circuit such as DSP for simplification of the system. The technology according to patent document 1 requires the 5 V power supply voltage for an input protection circuit. The analog front-end cannot be mounted on the integrated circuit provided with only a low voltage such as 3.3 V or 1.5 V as mentioned above. The technology according to patent document 2 performs capacity division and coupling to divide the logic signal voltage amplitude and therefore cannot be used for analog signal transmission described in this application.

We also considered providing a resistance divider circuit operating on 5 V for the optical pickup integrated circuit and supply input to an input circuit for the DSP. However, this construction increases external devices and needs to ensure division resistance sufficiently larger than the output resistance of the optical pickup integrated circuit. Such division resistance and a relatively large input capacity for the integrated circuit make it difficult to obtain good signal transmission.

It is an object of the present invention to provide a semiconductor device capable of supplying an analog input signal greater than or equal to an operating power supply voltage. It is another object of the present invention to provide a semiconductor device capable of rationally supplying an analog input signal from a DVD optical pickup. These and other objects and novel features of the invention may be readily ascertained by referring to the following description and appended drawings.

The following describes an overview of representative means of the invention disclosed in this application. An electrostatic discharge protection circuit corresponding to the analog input signal is provided for an external terminal that is supplied with an analog input signal generated with a first power supply voltage. A voltage divider resistor divides the analog input signal passing through the electrostatic discharge protection circuit into a voltage corresponding to a second power supply voltage lower that the first power supply voltage. An input circuit operating on the second power supply voltage receives the analog input signal divided by the voltage divider resistor to form an internal analog signal. There are provided first and second unidirectional elements. The first unidirectional element passes current from the input circuit s input terminal to the second power supply voltage. The second unidirectional element passes current from a circuit ground potential to a first circuit's input terminal.

It is possible to ensure good signal transmission and supply an analog input signal higher than or equal to an operating voltage.

BRIEF DESCRIPTION OF THE DRAWINGS

FIG. 15 is a waveform diagram for describing power control by an FMD of the DVD recording/reproducing apparatus according to the invention.

DETAILED DESCRIPTION OF THE PREFERRED EMBODIMENTS

Figure 1:
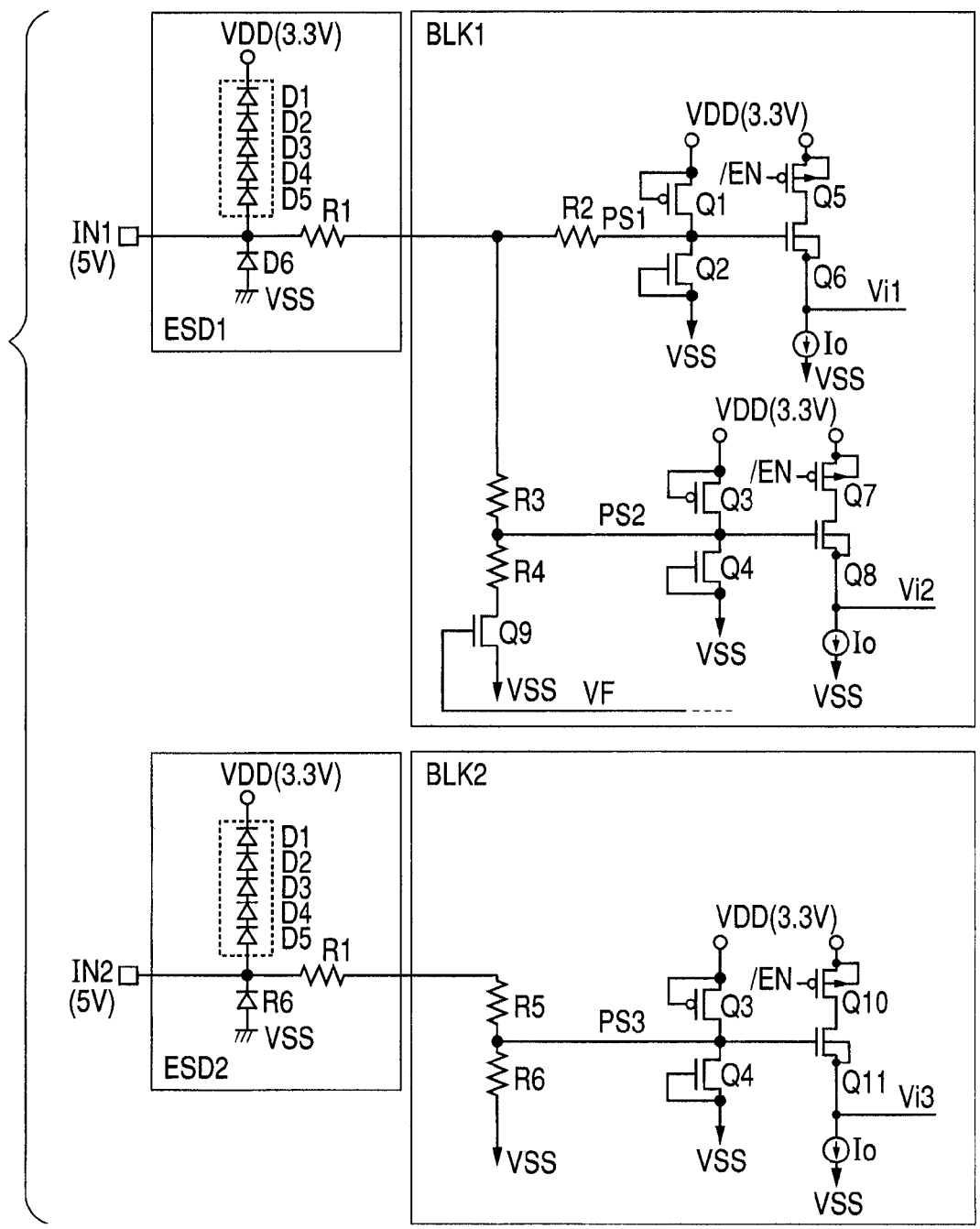
FIG. 1 is a circuit diagram showing an embodiment of an analog input circuit according to the invention.

FIG. 1 shows a circuit diagram for an embodiment of an analog input circuit according to the invention. The analog input circuit according to the embodiment is composed of electrostatic discharge protection circuits ESD1 and ESD2, and circuit blocks BLK1 and BLK2. The electrostatic discharge protection circuits ESD1 and ESD2 are provided for input terminals IN1 and IN2, respectively. The circuit block BLK1 receives an analog signal passing through the electrostatic discharge protection circuits ESD1 and ESD2. The circuit block BLK2 receives an analog signal from the input terminal IN2. The input terminal IN1 and IN2 are supplied with an analog signal generated from a DVD optical pickup IC operating on 5 V, for example.

The electrostatic discharge protection circuit ESD1 is provided between the input terminal IN1 and power supply voltage VDD. The electrostatic discharge protection circuit ESD1 includes diodes D1 through D6. The diodes D1 through D5 are serially connected to pass a current from the input terminal to the power supply voltage VDD. The diode D6 is provided between the input terminal IN1 and ground potential VSS of the circuit to pass a current from the ground potential VSS to the input terminal IN1. Although not limited to the following, the power supply voltage VDD is low such as 3.3 V compared to an operating voltage of 5 V for the optical pickup IC. The number of serially connected diodes D1 through D5 is determined so as to prevent an analog signal supplied to the input terminal IN1 from causing the above-mentioned current to flow.

During a normal operation, the electrostatic discharge protection circuit ESD1 does not form the above-mentioned current path. The electrostatic discharge protection circuit ESD1 has no effect on an analog signal and transmits it to the circuit block BLK1 via resistor R1. When a positive high voltage is applied due to static electricity during caused by transport or handling, the serially connected diodes D1 through D5 form a discharge path to prevent destruction of a gate in MOSFET provided for the circuit block BLK1. When a negative high voltage is applied due to static electricity, the diode D6 forms a discharge path to prevent destruction of a gate in MOSFET provided for the circuit block BLK1.

Electrostatic discharge protection circuit ESD2 corresponds to the input terminal IN2 and, similarly to the electrostatic discharge protection circuit ESD1, includes the series circuit of the diodes D1 through D5, the diode D6, and the resistor R1. The electrostatic discharge protection circuit ESD2 prevents destruction of a gate in MOSFET provided for the circuit block BLK1 due to static electricity occurring at the input terminal IN2. During a normal operation, the electrostatic discharge protection circuit ESD2 does not form the above-mentioned current path. The electrostatic discharge protection circuit ESD1 has no effect on an analog signal and transmits it to the circuit block BLK2 via the resistor R1.

The circuit block BLK1 includes two input circuits corresponding to input paths PS1 and PS2. The input path PS1 is provided with a clamp function. That is, the output resistor R1 of the electrostatic discharge protection circuit ESD1 is serially connected to input resistor R2 and is connected to the input terminal. Diode-connected P-channel MOSFET Q1 is provided as a high-level-side clamp device between the input terminal and the power supply voltage VDD. The gate of MOSFET Q1 is connected to power supply voltage conductor VDD. Supplying the terminal with a voltage higher than or equal to VDD+VF (a turn-on voltage for the diode-connected P-channel MOSFET Q1) turns on a parasitic diode between the drain and the backgate of the MOSFET Q1 to pass a current. This drops a voltage of the resistor R2 and sets the maximum value of output signal Vi1 to the VDD level. Although not limited to the following, diode-type N-channel MOSFET Q2 is provided as a low-level clamp device between the input terminal and ground potential VSS of the circuit. The gate of MOSFET Q2 is connected to grounding conductor VSS of the circuit.

The input terminal is connected to the gate of N-channel MOSFET Q6 constituting an input circuit. The source of MOSFET Q6 is provided with constant current source Io as a load. The MOSFET Q6 provides a source follower circuit that outputs internal analog signal Vi1 from the source. P-channel MOSFET Q5 is provided between the drain of the MOSFET Q6 and the power supply voltage VDD. The gate of the MOSFET Q5 is supplied with an enable signal/EN. When the enable signal/EN is set to the low level, the MOSFET Q5 turns on to enable an operation of the source follower circuit using the MOSFET Q6. When the enable signal/EN is set to the high level, the MOSFET Q5 turns off to interrupt an operating current for the source follower circuit and set the signal to the low level.

The input path PS2 is provided with an attenuator function. Voltage divider resistors R3 and R4 divide the analog signal passing through the output resistor R1 in the electrostatic discharge protection circuit ESD1. The divided voltage forms the input path PS2 that is connected to the input terminal. Although not limited to the following, diode-connected P-channel MOSFET Q3 is provided as a high-level clamp device between the input terminal and the power supply voltage VDD. The gate of the MOSFET Q3 is connected to power supply voltage conductor VDD. Diode-type N-channel MOSFET Q4 is provided as a low-level clamp device between the input terminal and ground potential VSS of the circuit. The gate of MOSFET Q4 is connected to the grounding conductor VSS of the circuit. The clamp device clamps a voltage to protect an input voltage when a divided analog signal from the input path PS2 unexpectedly becomes higher than or equal to the power supply voltage VDD or becomes a negative voltage smaller than or equal to the circuit's ground potential. The clamp device differs from that for the input path PS1 in the meaning of addition to the circuit.

The input terminal is connected to the gate of N-channel MOSFET Q8 constituting an input circuit. The source of MOSFET Q8 is provided with constant current source Io as a load. The MOSFET Q8 provides a source follower circuit that outputs internal analog signal Vi2 from the source. P-channel MOSFET Q7 is provided between the drain of the MOSFET Q8 and the power supply voltage VDD. The gate of the MOSFET Q7 is supplied with an enable signal/EN. When the enable signal/EN is set to the low level, the MOSFET Q7 turns on to enable an operation of the source follower circuit using the MOSFET Q8. When the enable signal/EN is set to the high level, the MOSFET Q7 turns off to interrupt an operating current for the source follower circuit and set the output signal to the low level.

Although not limited to the following, N-channel MOSFET Q9 is provided to ground-side terminals of the voltage divider resistors R3 and R4. The gate of the MOSFET Q9 is supplied with feedback voltage VF and operates as a variable resistor. That is, the feedback voltage VF is generated in comparison with a reference potential (direct current component) of the analog signal supplied via the input path PS2. This provides control so that the reference potential matches a specified voltage. When such level adjustment function is not provided, the MOSFET Q9 may be omitted and the resistor R4 may be connected to the ground potential conductor VSS.

The circuit block BLK2 includes one input circuit having the attenuator function. Voltage divider resistors R3 and R4 divide the analog signal passing through the output resistor R1 in the electrostatic discharge protection circuit ESD2. The divided voltage forms input path PS3 that is connected to the input terminal. Similarly to the above, the diode-connected P-channel MOSFET Q3 is provided as a high-level clamp device between the input terminal and the power supply voltage VDD. The gate of the MOSFET Q3 is connected to the power supply voltage conductor VDD. The diode-type N-channel MOSFET Q4 is provided as a low-level clamp device between the input terminal and the ground potential VSS of the circuit. The gate of the MOSFET Q4 is connected to the grounding conductor VSS of the circuit. The clamp device is provided similarly to the input path PS2.

The input terminal is connected to the gate of N-channel MOSFET Q11 constituting an input circuit. The source of MOSFET Q11 is provided with the constant current source Io as a load. The MOSFET Q11 provides a source follower circuit that outputs internal analog signal Vi3 from the source. P-channel MOSFET Q10 is provided between the drain of the MOSFET Q11 and the power supply voltage VDD. The gate of the MOSFET Q10 is supplied with an enable signal/EN. When the enable signal/EN is set to the low level, the MOSFET Q10 turns on to enable an operation of the source follower circuit using the MOSFET Q11. When the enable signal/EN is set to the high level, the MOSFET Q10 turns off to interrupt an operating current for the source follower circuit and set the output signal to the low level.

The input terminals IN1 and IN2 supply a 5-V signal voltage. The resistors R1 through R6 are made of polysilicon resistors to ensure a withstand voltage against the signal voltage from the input terminals IN1 and IN2. The resistor device may or may not be a polysilicon resistor when it has a withstand voltage of 5 V.

Figure 2:
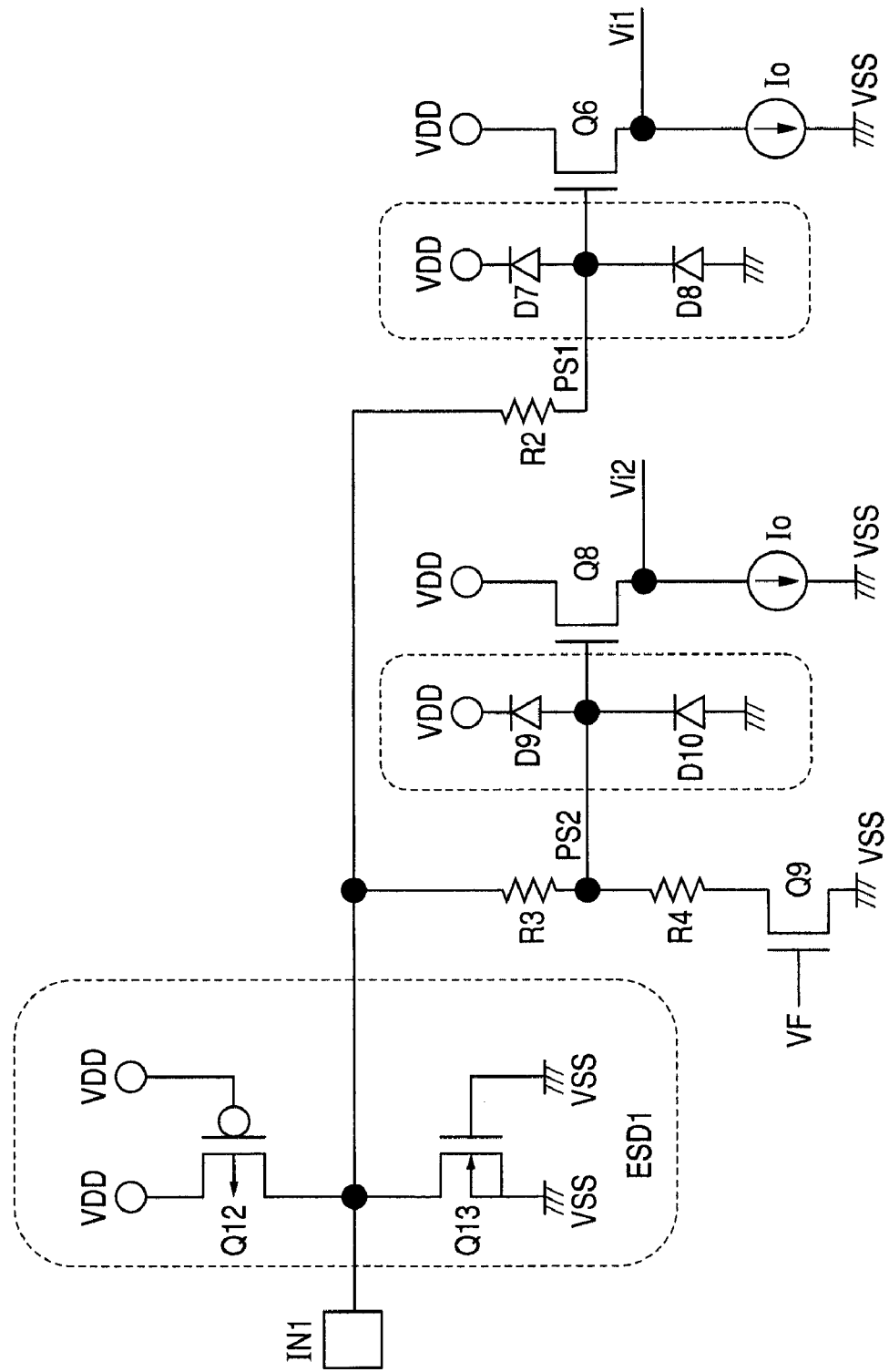
FIG. 2 is a circuit diagram showing another embodiment of the analog input circuit according to the invention.

FIG. 2 shows a circuit diagram for another embodiment of the analog input circuit according to the invention. The embodiment provides a modification of the electrostatic discharge protection circuit ESD1 corresponding to the input terminal IN1. The electrostatic discharge protection circuit ESD1 according to the embodiment uses P-channel MOSFET Q12 and N-channel MOSFET Q13 instead of the diodes D1 through D6. The source-drain path of the MOSFET Q12 is connected between the power supply voltage terminal VDD and the input terminal IN1. The gate of the MOSFET Q12 is connected to the power supply voltage terminal VDD.

According to the embodiment, a substrate gate (channel portion) is floated so as not to connect with the source and the drain of the MOSFET Q12. As a result, a parasitic diode between the substrate gate (channel portion) and the source/drain region of the MOSFET Q12 is prevented from being inserted into a current path between the input terminal IN1 and the power supply voltage VDD. A punch-through current between the source and the drain of the MOSFET Q12 discharges a positive high voltage caused by static electricity occurring at the input terminal IN1. The source-drain path of the MOSFET Q13 is connected between the input terminal IN1 and the circuit's ground potential terminal VSS. The gate of the MOSFET Q13 is connected to the ground potential terminal VSS. The substrate gate (channel portion) is connected to the ground potential terminal.

The embodiment omits the resistor R1 in FIG. 1. The MOSFETs Q1 through Q4 in FIG. 1 are replaced by diodes D7 through D10. The embodiment omits the MOSFETs Q5 and Q7 as power switch devices provided for the drains of the source followers MOSFETs Q6 and Q8. The other part of the construction is the same as that of the ESD1 and the BLK1 in FIG. 1.

Figure 3:
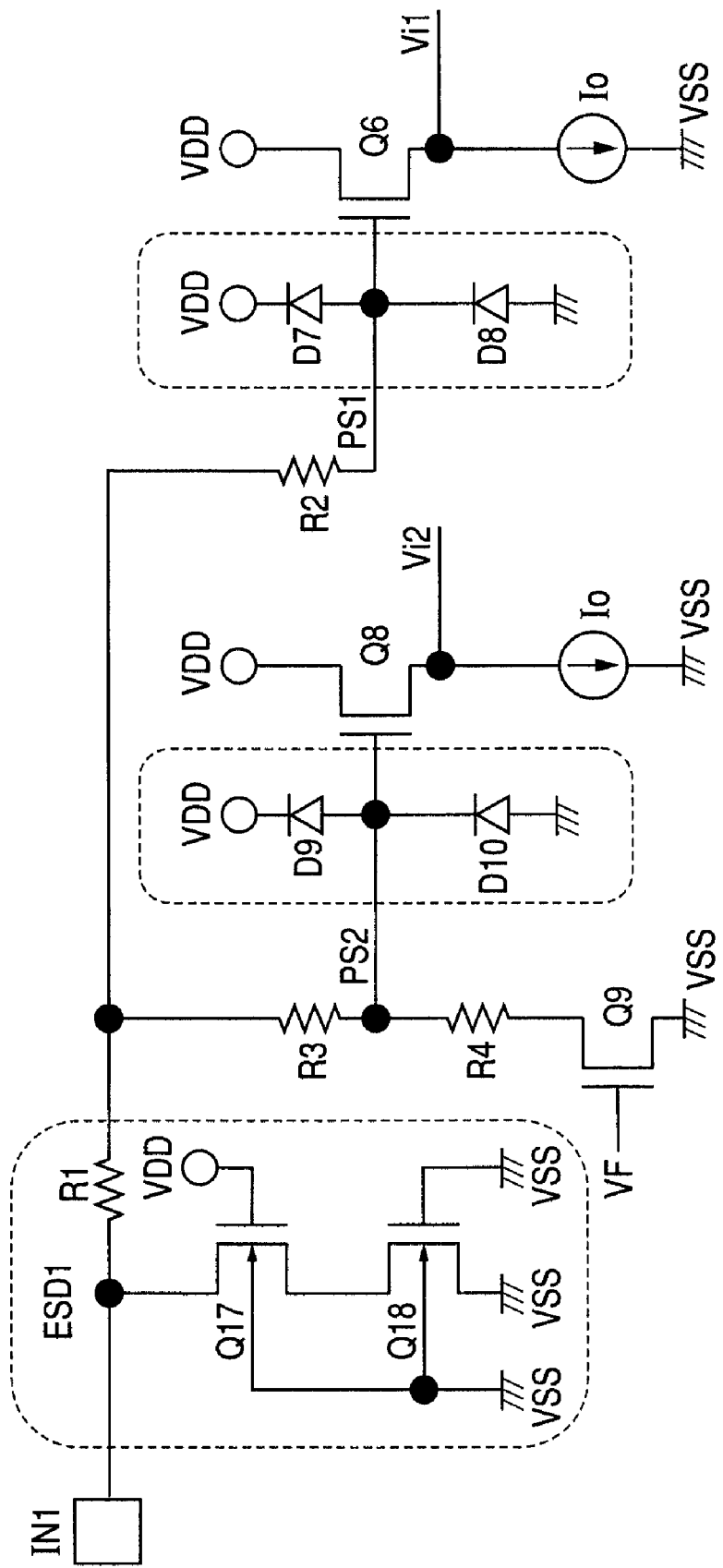
FIG. 3 is a circuit diagram showing yet another embodiment of the analog input circuit according to the invention.

FIG. 3 shows a circuit diagram for yet another embodiment of the analog input circuit according to the invention. The embodiment provides a modification of the electrostatic discharge protection circuit ESD1 corresponding to the input terminal IN1. The electrostatic discharge protection circuit ESD1 according to the embodiment uses N-channel MOSFETs Q17 and Q18 instead of the diodes D1 through D6. The drain of the MOSFET Q17 is connected to the input terminal IN. The drains of the MOSFETs Q17 and Q18 are connected to each other. The source of the MOSFET Q18 is connected to the circuit's ground potential terminal VSS. The gate of the MOSFET Q17 is fixed to a VDD potential. The gate of the MOSFET Q18 is fixed to a VSS potential. According to the embodiment, the MOSFET Q17 always turns on and the MOSFET Q18 always turns off. A positive high potential applied to the input terminal IN1 is discharged via the drain and the source of the MOSFET Q17 to the VSS terminal when the positive high potential is greater than or equal to a reverse breakdown potential for the parasitic diode between the drain of the MOSFET Q18 and the substrate.

Figure 4:
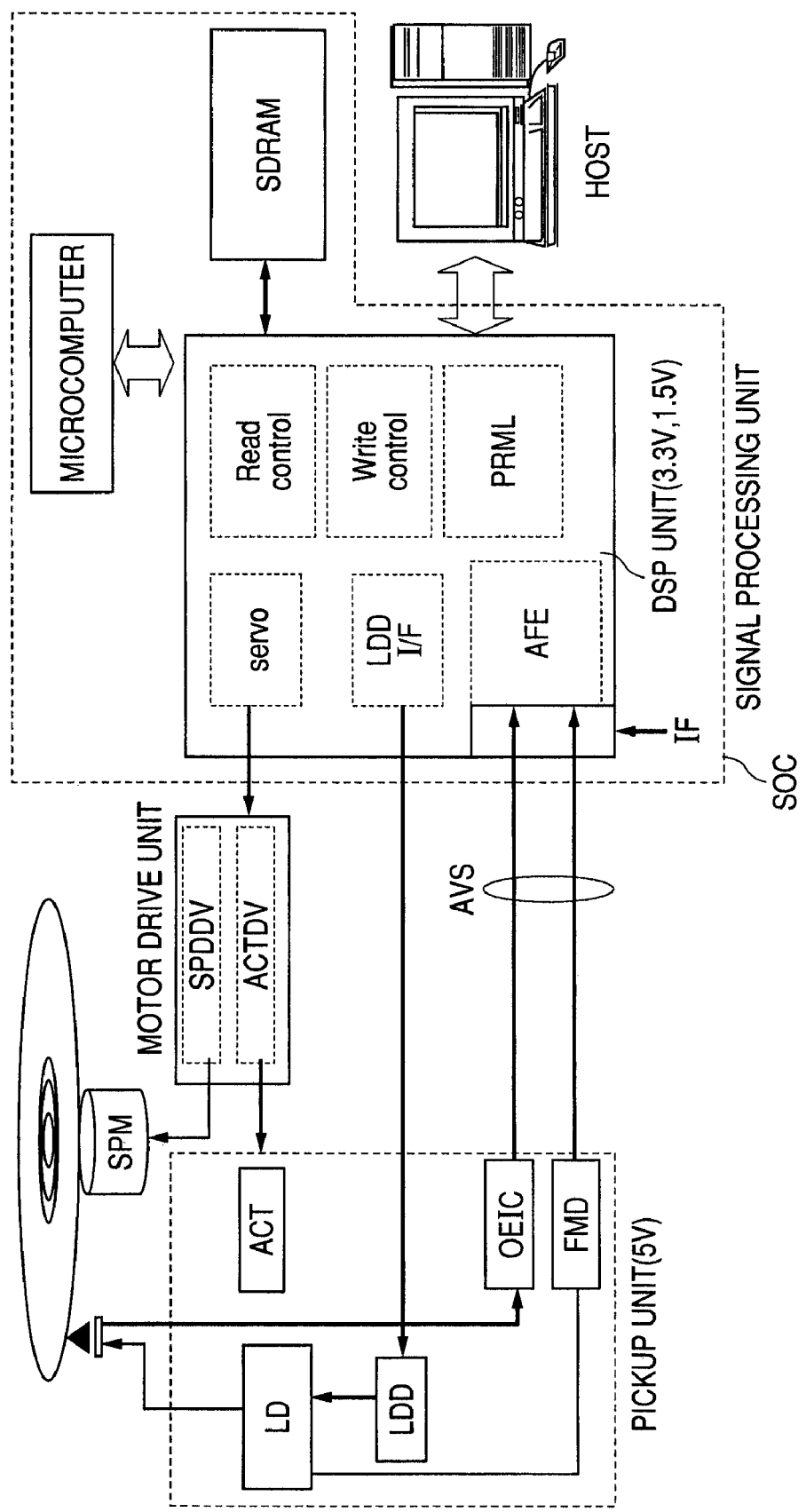
FIG. 4 is an overall block diagram showing an embodiment of a DVD recording/reproducing apparatus using the analog input circuit according to the invention.

FIG. 4 shows an overall block diagram for an embodiment of a DVD recording/reproducing apparatus using the analog input circuit according to the invention. The DVD recording/reproducing apparatus according to the embodiment broadly includes a pickup unit, a motor drive unit, and a signal processing unit. Although not limited to the following, the DVD recording/reproducing apparatus is connected to a personal computer as a host for outputting a reproduced image from and inputting a recorded image to the DVD recording/reproducing apparatus.

The motor drive unit includes a spindle driver SPDDV and an actuator driver AC. The pickup unit includes a laser diode LD, a laser diode drive circuit LDD, a photoelectric conversion circuit OEIC, a front monitor FMD for monitoring a laser diode output, and an actuator ACT. The OEIC and the FMD operate on a 5-V power supply voltage. A 5-V analog signal AVS is output from the OEIC and the FMD and is supplied to an interface IF provided for a DSP of the signal processing unit. The interface IF includes an analog input circuit as shown in FIGS. 1, 2, and 3.

The signal processing unit includes the DSP (digital signal processor) unit, a microcomputer, and memory SDRAM. The signal processing unit is provided as a SiP (system-in-package) type semiconductor device in which each of the components is constructed as one semiconductor chip and is mounted on the same package. The microcomputer as a control unit may be mounted on the same semiconductor chip as the DSP unit. The DSP unit operates on a low voltage such as 3.3 V or 1.5 V. The DSP unit includes the interface IF as shown in FIGS. 1, 2, and 3 capable of directly supplying the 5-V analog signal AVS.

The DSP unit includes an analog front-end AFE having the interface IF, a signal processing unit (PRML), a Write control, a Read control, a laser diode driver interface (LDD I/F), and a servo. The microcomputer generates various control signal for DVD recording and reproduction. The memory SDRAM, synchronous dynamic random access memory, is used for temporarily storing recording/reproduction data.

Figure 5:
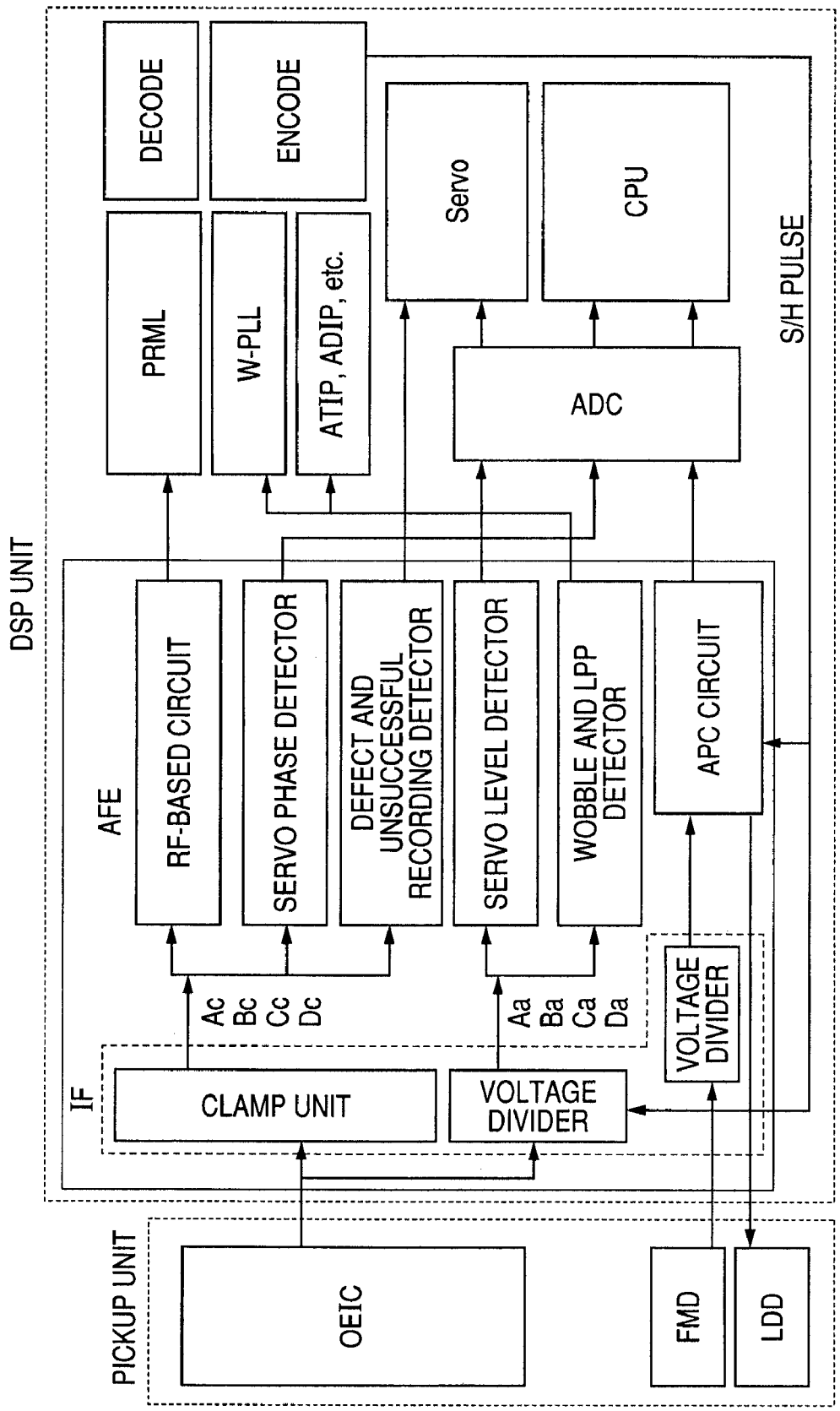
FIG. 5 is a block diagram showing an embodiment of a DSP unit in FIG. 4.

FIG. 5 shows a block diagram for an embodiment of the DSP unit in FIG. 4. The OEIC and the FMD of the pickup unit supply 5-V input signals. The signals are supplied to three input circuits corresponding to the input paths PS1 through PS3 provided for the interface IF as shown in FIG. 1. A clamp unit is equivalent to the input path PS1 and generates four internal signals Ac, Bc, Cc, and Dc supplied from the OEIC. A voltage division unit corresponding to the OEIC is equivalent to the input path PS2 and generates four internal signals Aa, Ba, Ca, and Da supplied from the OEIC. A voltage division unit corresponding to the FMD is equivalent to the input path PS3 and generates an internal signal supplied from the FMD.

The analog front-end AFE includes: an RF circuit for receiving the internal signals Ac, Bc, Cc, and Dc; a servo phase detection circuit; defect and unsuccessful recording detection circuits, a servo level detection circuit for receiving the internal signals Aa, Ba, Ca, and Da; wobble and LPP detection circuits; and an APC circuit for receiving signals from the FMD. Except the DSP unit, the signal processing unit includes: ADC (analog/digital conversion circuit); CPU (microcomputer); Servo; interfaces such as ATIP and ADIP; W-PLL; ENCODE; DECODE; and PRML. The DSP unit according to the embodiment includes the on-chip microcomputer as shown in FIG. 4.

When a signal is input from the photoelectric conversion circuit OEIC via the interface IF, the analog front-end AFE converts the input signal into a signal having a level appropriate for circuits in the LSI. The analog front-end AFE includes an RF-based circuit that extracts an envelope from a high-frequency reproduction signal supplied from the pickup. Further, the analog front-end AFE includes detection circuits for detecting a wobble for the pickup, an LPP (Land Pre-Pit), and an ID region based on the wobble. Moreover, the analog front-end AFE includes detection circuits for detecting MIRR and Defect. The LPP unit records address information at a land between grooves to be described later.

The MIRR detection provides an appropriate threshold value level between the top and the bottom of a reproduction signal envelope for track access. The MIRR detection is used for ripple detection when the pickup travels along a track. The Defect detection is used to determine the presence or absence of a defect by detecting whether or not a reflected ray's top level is decreased due to a defect or a scratch on the disk surface. The analog front-end AFE further includes a servo-type circuit, an OPC circuit, an automatic power control circuit APC, and a register which is not shown. The servo-type circuit processes a signal from the pickup for alignment in the focus or tracking direction. The OPC circuit extracts a signal for verifying the recording quality. The automatic power control circuit (APC) controls output from a light emitting device. The register stores a setup value from a high-order control apparatus.

The optical pickup unit includes a driver LDD and a front monitor FMD. The driver LDD drives a laser diode that radiates a laser beam to an optical disk. The front monitor FMD detects the emission intensity to keep the constant amount of light for the laser diode. Further, the optical pickup unit includes the photoelectric conversion circuit OEIC and the actuator ACT. The photoelectric conversion circuit OEIC converts a reflected ray from an optical disk into an electric signal and amplifies it. The actuator ACT provides alignment in the focus or tracking direction. The actuator ACT is controlled by the motor drive unit in FIG. 4 and is omitted from FIG. 5.

The digital signal processing unit DSP includes: an AD conversion circuit ADC which analog-digital converts a signal from the analog front-end AFE; a central processing unit (microcomputer) CPU which follows a program to control the entire system; a servomechanism which performs a digital operation process for lens alignment based on a servo signal from the analog front-end AFE; and a synchronization circuit W-PLL which generates a read clock for synchronization of reading from a reproduction signal and generates a write clock needed for recording on a disk. The digital signal processing unit DSP further includes: ATIP and ADIP units which generate address information according to wobble phase modulation based on a wobble detection signal and generate absolute position information according to phase modulation of a wobble on a CD-R/W; a decoder DECODE which decodes read data, corrects an error, and decompresses data; and an encoder ENCODE which encodes (compresses) write data.

Figure 6:
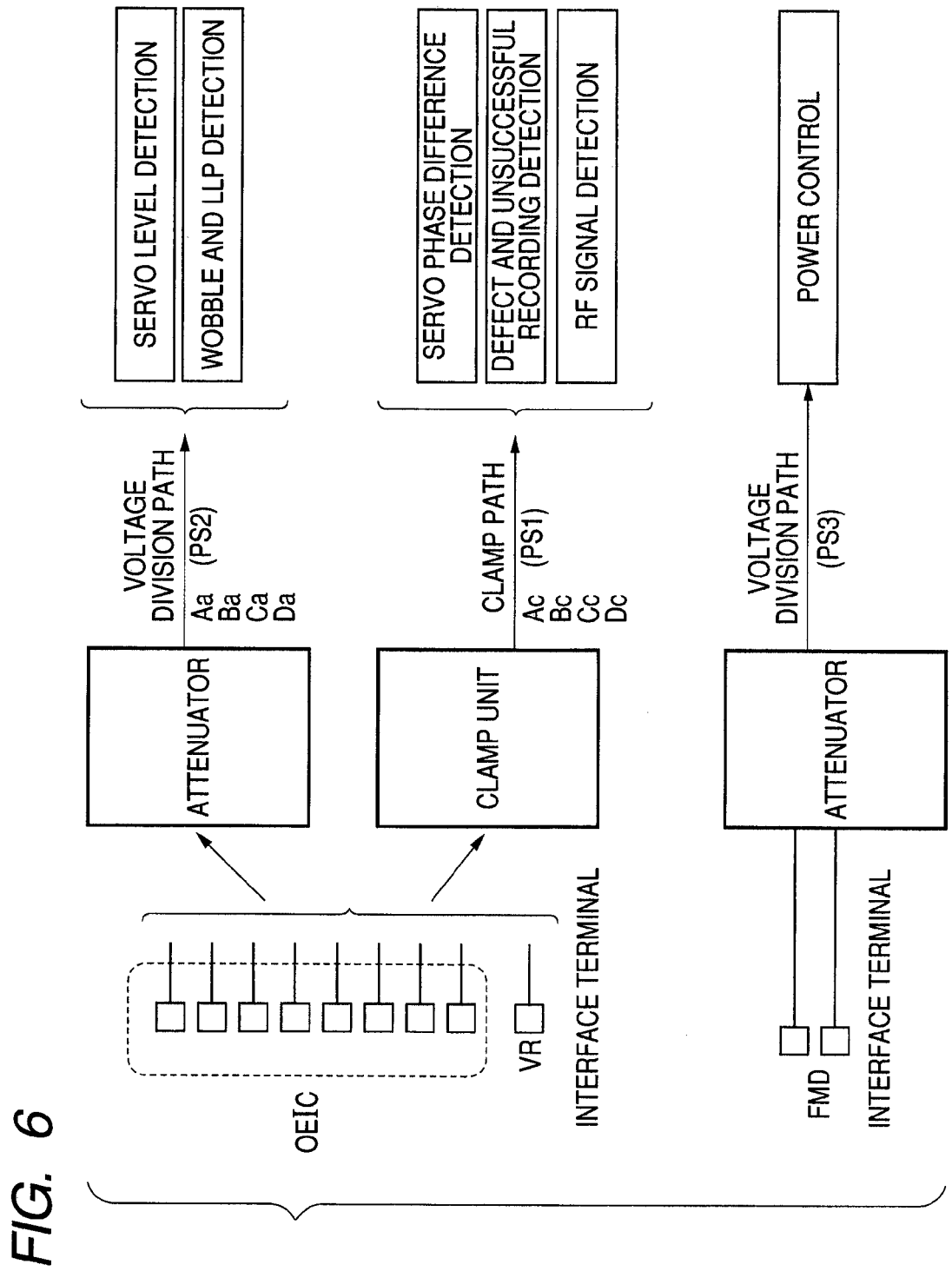
FIG. 6 is a detailed block diagram showing an embodiment of an interface IF in FIG. 5.

FIG. 6 shows a detailed block diagram showing an embodiment of the interface IF in FIG. 5. The embodiment adds reference voltage terminal VR as an OEIC interface terminal. When a reference voltage is supplied from the reference voltage terminal VR, the voltage is used to adjust the level of an internal analog signal supplied from the OEIC interface terminal. Similarly to the embodiment in FIG. 4, a voltage division path (PS2) forms the internal signals Aa, Ba, Ca, and Da and is used to detect a servo level, wobble, and LPP. Similarly to the embodiment in FIG. 4, a clamp path (PS1) forms the internal signals Ac, Bc, Cc, and Dc and is used to detect an RF signal, servo phase, defect, and unsuccessful recording. Similarly to the embodiment in FIG. 5, a voltage division path (PS3) forms an internal signal corresponding to the FMD and is used for power control.

Figure 7:
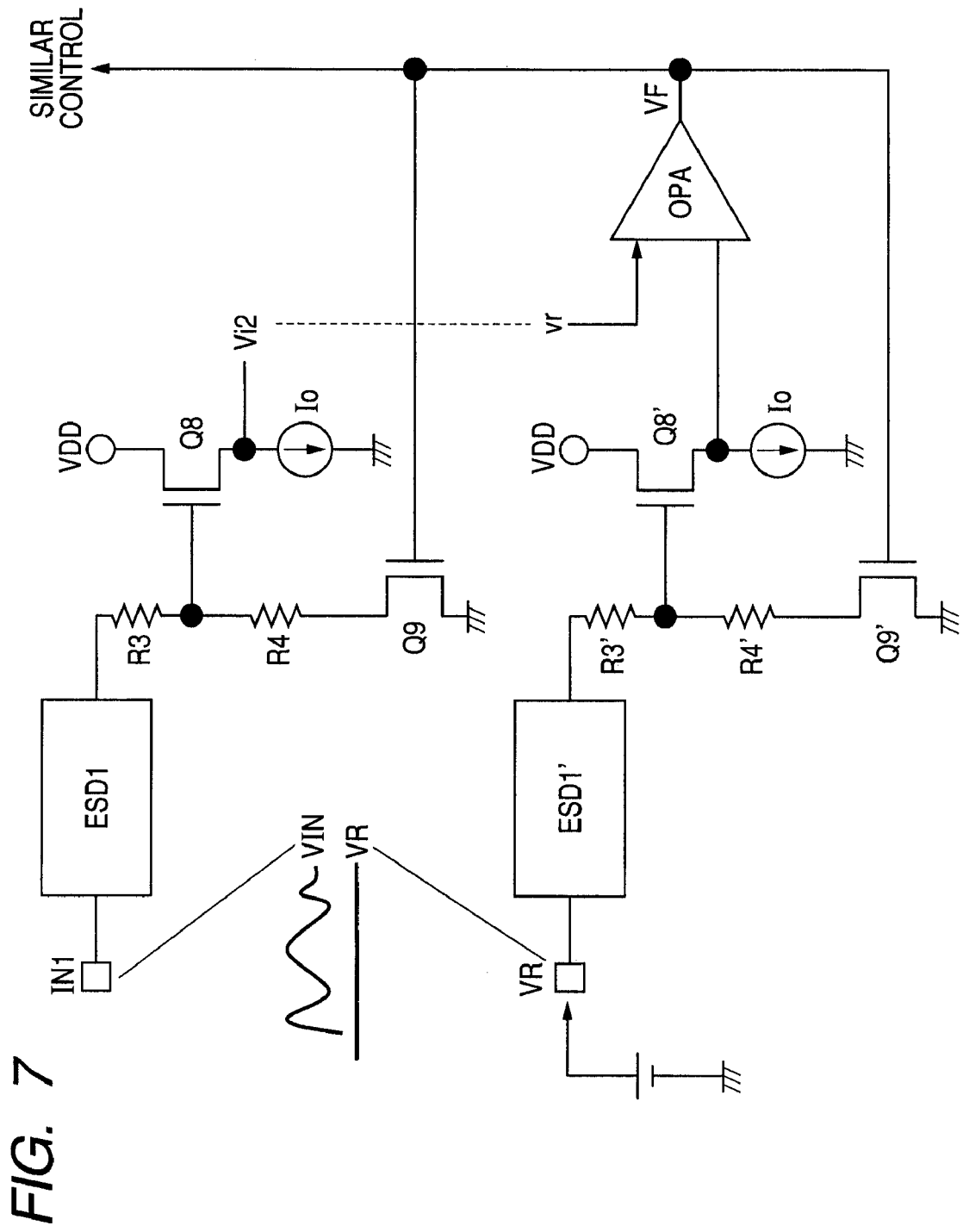
FIG. 7 is a circuit diagram showing still yet another embodiment of the analog input circuit according to the invention.

FIG. 7 shows a circuit diagram for still yet another embodiment of the analog input circuit according to the invention. The embodiment provides an ESD1' circuit for the reference voltage terminal VR in FIG. 6. The ESD1' circuit is similar to the electrostatic discharge protection circuit ESD1 corresponding to the input terminal IN. A voltage supplied from the reference voltage terminal VR may become higher than the DSP's power supply voltage VDD (3.3 V). For this reason, the electrostatic discharge protection circuit ESD1' complies with the input terminal IN1.

Divider circuits R3' and R4' divide the reference voltage supplied from the reference voltage terminal VR. The divided output is incorporated through a source follower circuit of MOSFET Q8' and is supplied to one of inputs of an operational amplifier OPA. The other input of the operational amplifier OPA is supplied with internal reference voltage vr corresponding to internal signal Vi2 incorporated from the input terminal IN1. An output signal from the operational amplifier OPA becomes feedback voltage VF. The feedback voltage VF is used as a gate voltage for MOSFETs Q9 and Q9' that are serially connected to the voltage divider resistors R3 and R4 and R3' and R4', respectively.

The above-mentioned construction can supply an analog signal supplied from the input terminal IN1 and the reference voltage supplied from the reference voltage terminal VR as differential signals. That is, the internal circuit can process internal voltage Vi2 as a differential voltage for the internal reference voltage vr corresponding to the reference voltage VR. It is possible to process the internal signals Aa, Ba, Ca, Da, Ac, Bc, Cc, and Dc as differential voltages for the internal reference voltage vr corresponding to the reference voltage VR.

The analog IF unit processes the following internal signals. An OEIC output indicates the read level ranging from 2.1 to 2.2 V (typ) and the write level ranging from 2.1 to as large as 4.0 V (typ). An FMD output indicates the read level ranging from 2.4 to 2.6 V (typ) and the write level ranging from 1.5 to as large as 3.5 V (typ).

Of the OEIC outputs, a signal for the voltage division path (PS2) is used as an internal signal for the servo level detection. This is a low-frequency signal up to 1 MHz. The signal requires DC-level accuracy and provides a large gain adjustment range. A signal for the clamp path (PS1) is used as an internal signal for the servo phase difference detection. This is a high-frequency signal up to 100 MHz. The signal requires inter-channel phase accuracy. A signal for the clamp path (PS1) is used as an internal signal for the defect or unsuccessful recording detection. This is a high-frequency signal up to 60 MHz. The signal needs to be low noise. A signal for the clamp path (PS1) is used as an internal signal for the RF detection. This is a high-frequency signal up to 100 MHz. The signal needs to be low noise and low distortion. A signal for the voltage division path (PS2) is used as an internal signal for the WOBBLE and LPP signal detection. This is a high-frequency signal up to 100 MHz. A signal for the voltage division path (PS3) is used as an internal signal from the FMD for the laser power control. This is a high-frequency signal up to 100 MHz. The signal requires DC-level accuracy. In accordance with these signals, the signal paths PS1 through PS3 are selected.

Figure 8:
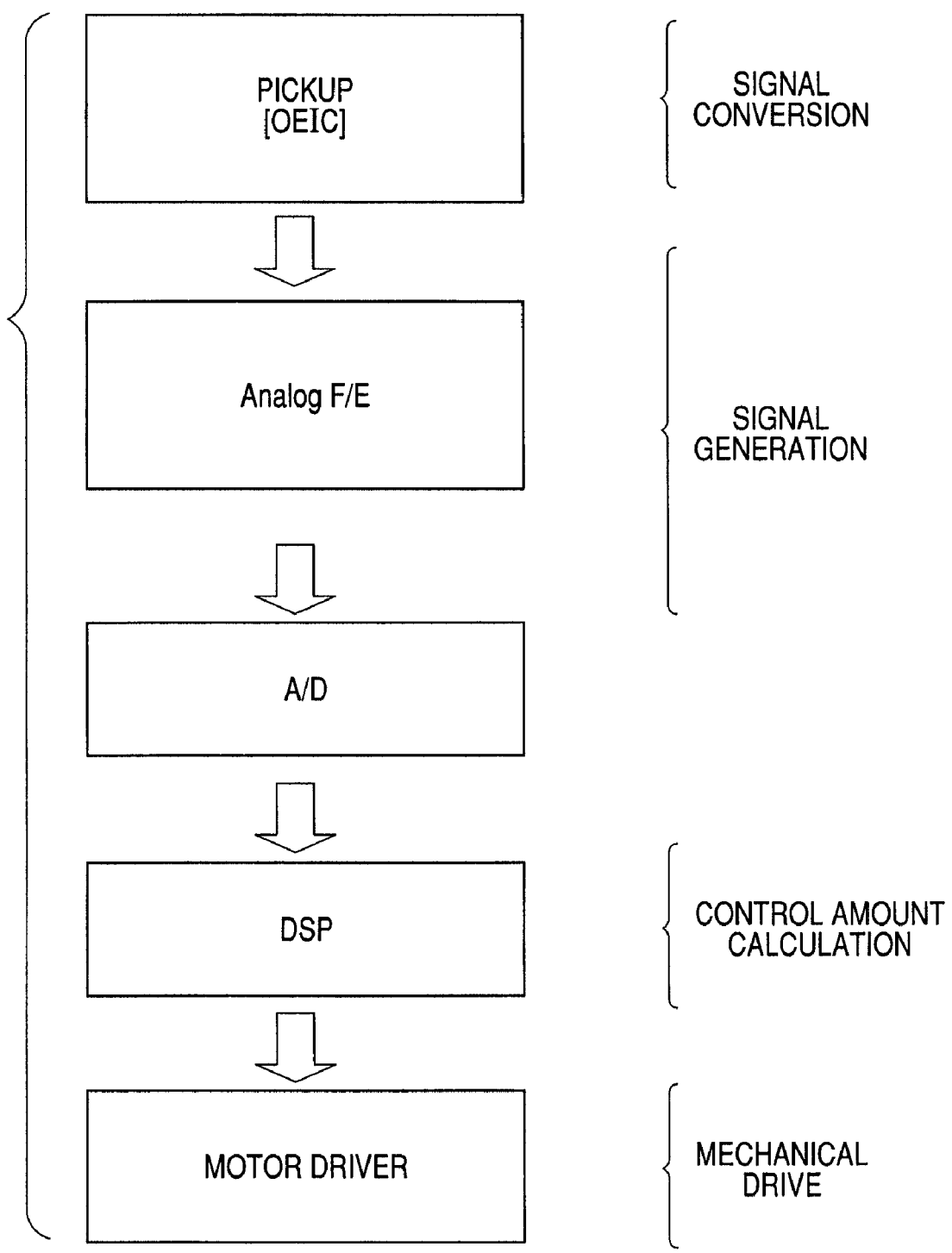
FIG. 8 is a flowchart describing servo control of the DVD recording/reproducing apparatus according to the invention.

FIG. 8 shows a flowchart describing the servo control. The optical pickup (OEIC) performs signal conversion, i.e., detecting a reflected ray and converting it into an electric signal. The analog front-end AFE performs signal generation. The analog front-end AFE generates an error signal at the current position by means of calculation and generates: (1) TE signal indicative of horizontal positional relationship; (2) FE signal indicative of vertical positional relationship; and (3) LE signal indicative of positional relationship with the lens. The analog/digital conversion circuit A/D digitizes the analog signals. The DSP performs control amount calculation. The DSP calculates a control amount from the detection signal. The motor driver is responsible for mechanical driving. The motor driver drives a motor and the other mechanism in accordance with an instruction from the DSP.

Figure 9:
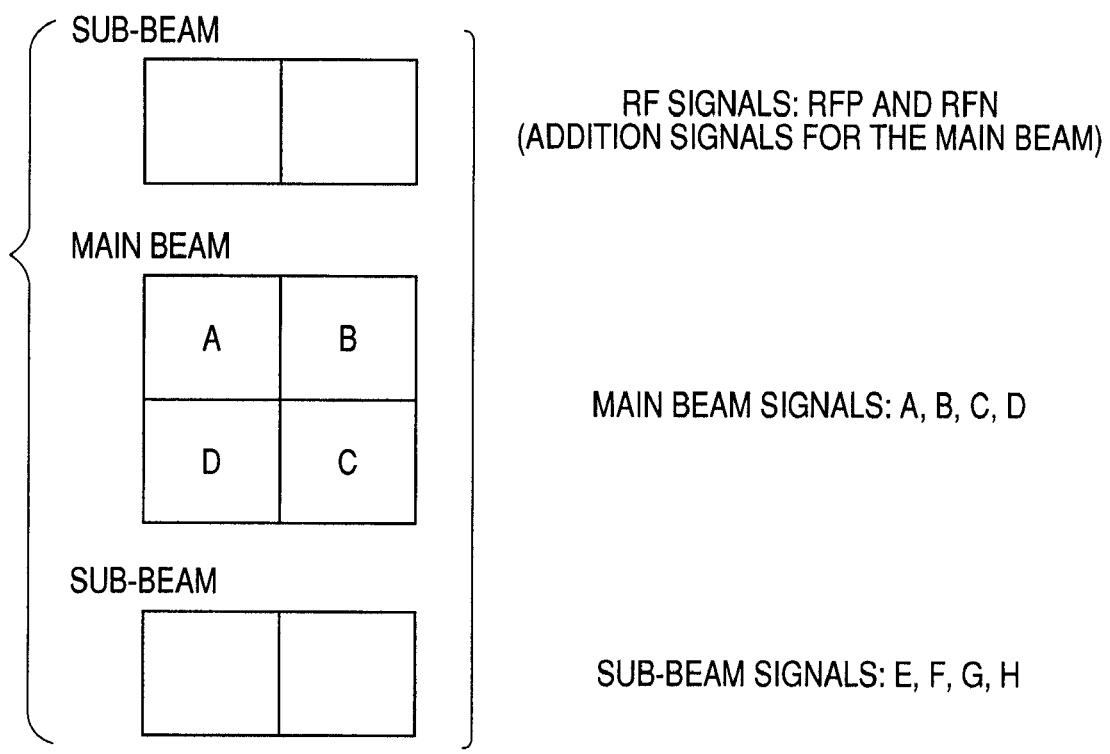
FIG. 9 is an explanatory diagram of servo signal operation for the DVD recording/reproducing apparatus according to the invention.

FIG. 9 shows an explanatory diagram of servo signal operation. A division photodetector picks up signals for a sub-beam and a main beam. RF signals RFP and RFN are used as addition signals for the main beam. There are four main beam signals A, B, C, and D. There are four sub-beam signals E, F, G, and H. The TE signal is represented as (A+D)−(B+C)−K{(E+H)−(F+G)} for DVD/CD recording media. The TE signal is represented as ($\phi$A−$\phi$B)+($\phi$C−$\phi$D) for the DVD-ROM phase difference detection (DPD detection). The FE signal is represented as (A+C)−(B+D). The LE signal is represented as (A+D)−(B+C)+K{(E+H)−(F+G)}. The PE signal is represented as (A+B+C+D).

Figure 10:
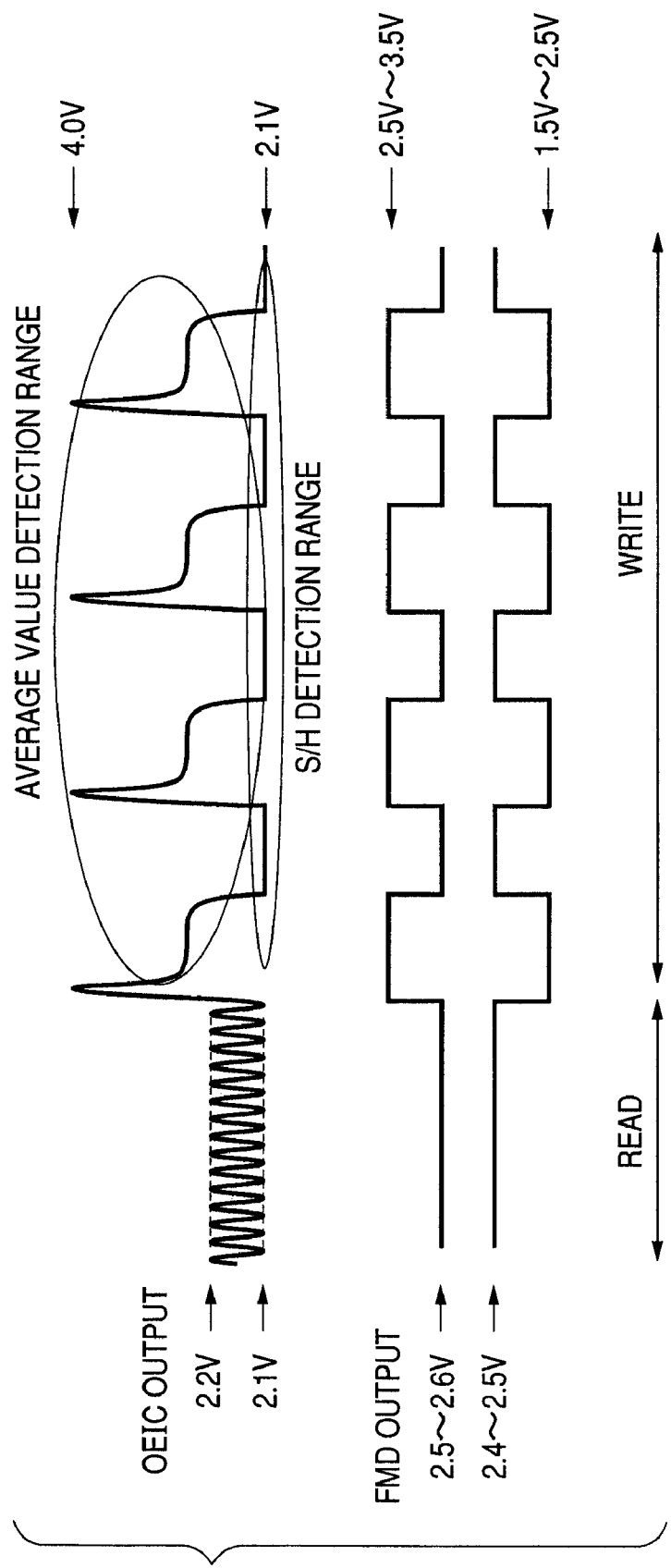
FIG. 10 is an output waveform diagram for OEIC and FMD in the DVD recording/reproducing apparatus according to the invention.

FIG. 10 shows an output waveform diagram for the OEIC and the FMD. The servo detection during writing includes average value detection and S/H detection. While the S/H detection only needs to detect a level up to 2.2 V, the average value detection needs to average levels up to 4.0 V. A servo detection signal is generated by averaging a signal resulting from the average value detection or the S/H detection to 1 MHz or lower and outputting a result of calculating the level. For this purpose, the above-mentioned voltage division path is used to detect the servo level.

Figure 11:
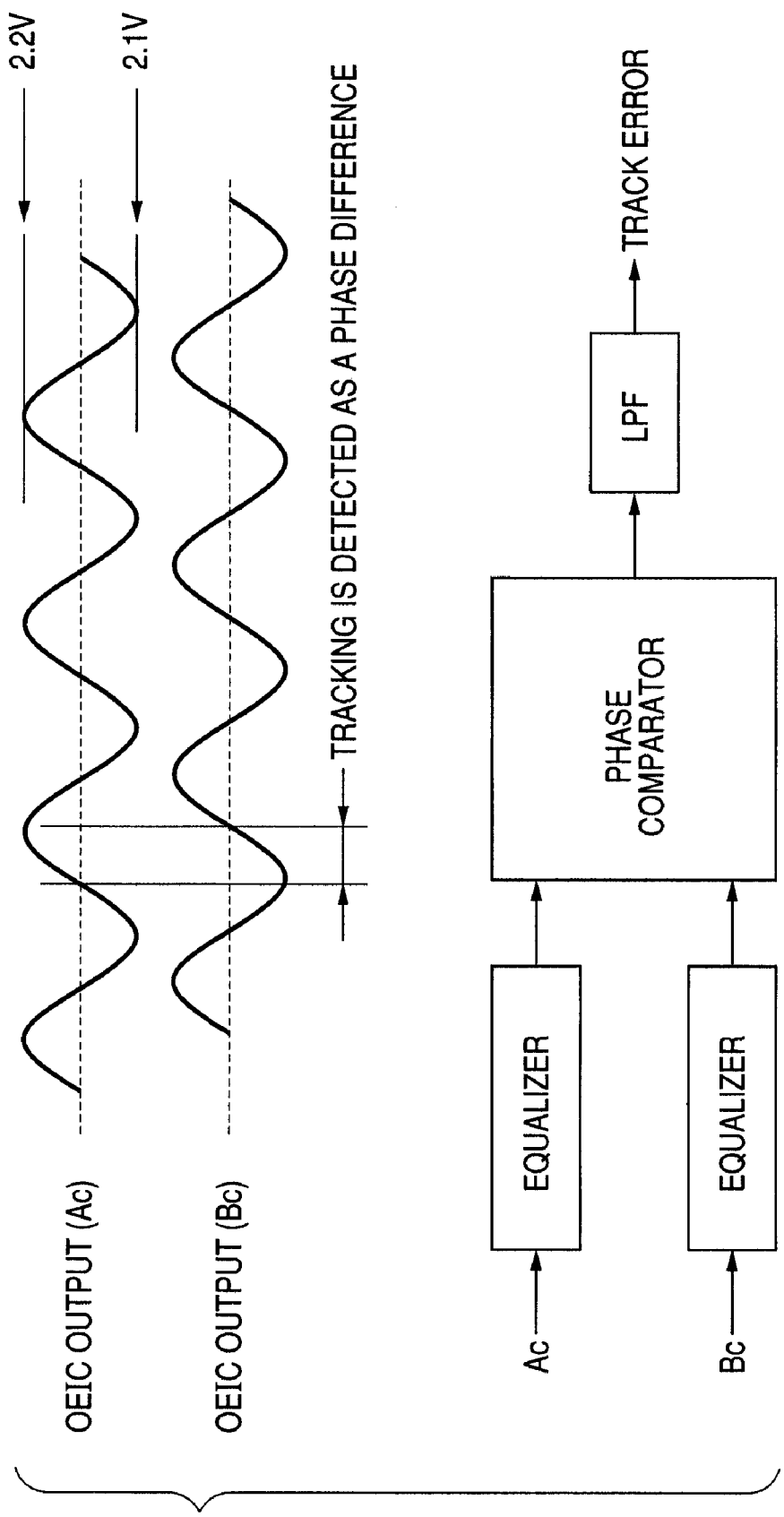
FIG. 11 is an explanatory diagram of servo phase difference detection in the DVD recording/reproducing apparatus according to the invention.

FIG. 11 shows an explanatory diagram of servo phase difference detection. Internal signals Ac and Bc are input to a phase comparator via equalizers. An output signal passes through an LPF (low pass filter) to generate a track error signal. Tracking of the internal signals Ac and Bc is detected as a phase difference. Since an RF signal needs to be detected, high frequency characteristics are needed. Since the detection sensitivity is high, low noise characteristics are needed. For this reason, the detection uses an input circuit using the clamp path (PS1), not the voltage division path.

Figure 12:
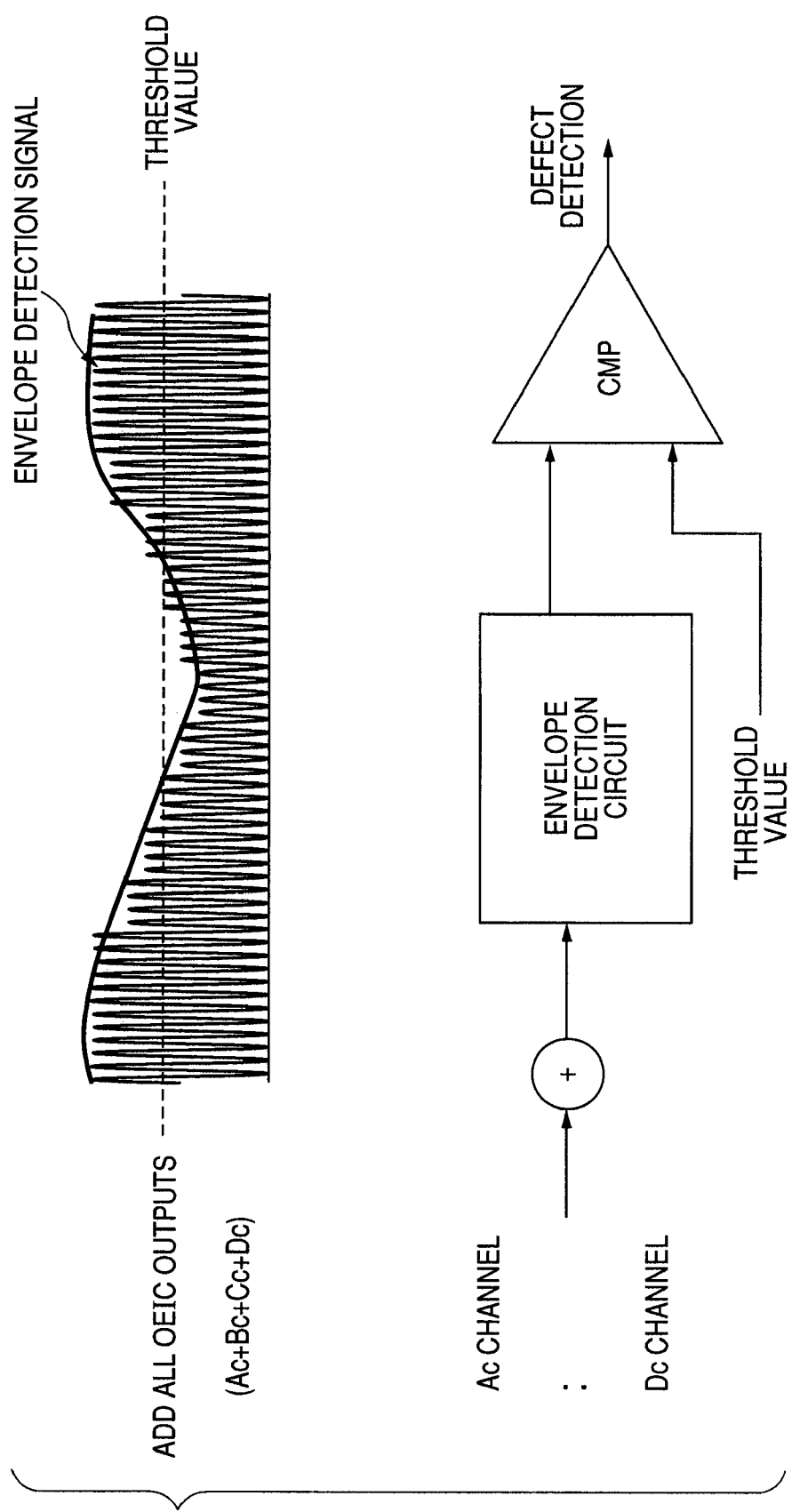
FIG. 12 is an explanatory diagram of defect detection in the DVD recording/reproducing apparatus according to the invention.

FIG. 12 shows an explanatory diagram of defect detection. The internal signals Ac through Dc are added and are supplied to an envelope detection circuit to detect an envelope. A comparator CMP compares the envelope with a threshold value to detect a defect. That is, an envelope is generated from addition of all outputs (Ac+Bc+Cc+Dc) from the OEIC. The envelope is compared to the threshold value indicated by a broken line. When the envelope is smaller than or equal to the threshold value, a defect is detected. The detection requires high-frequency and low-noise characteristics. During writing, the detection is unnecessary up to the top level. The clamp path (PS1) is used in favor of noise characteristics.

Figure 13:
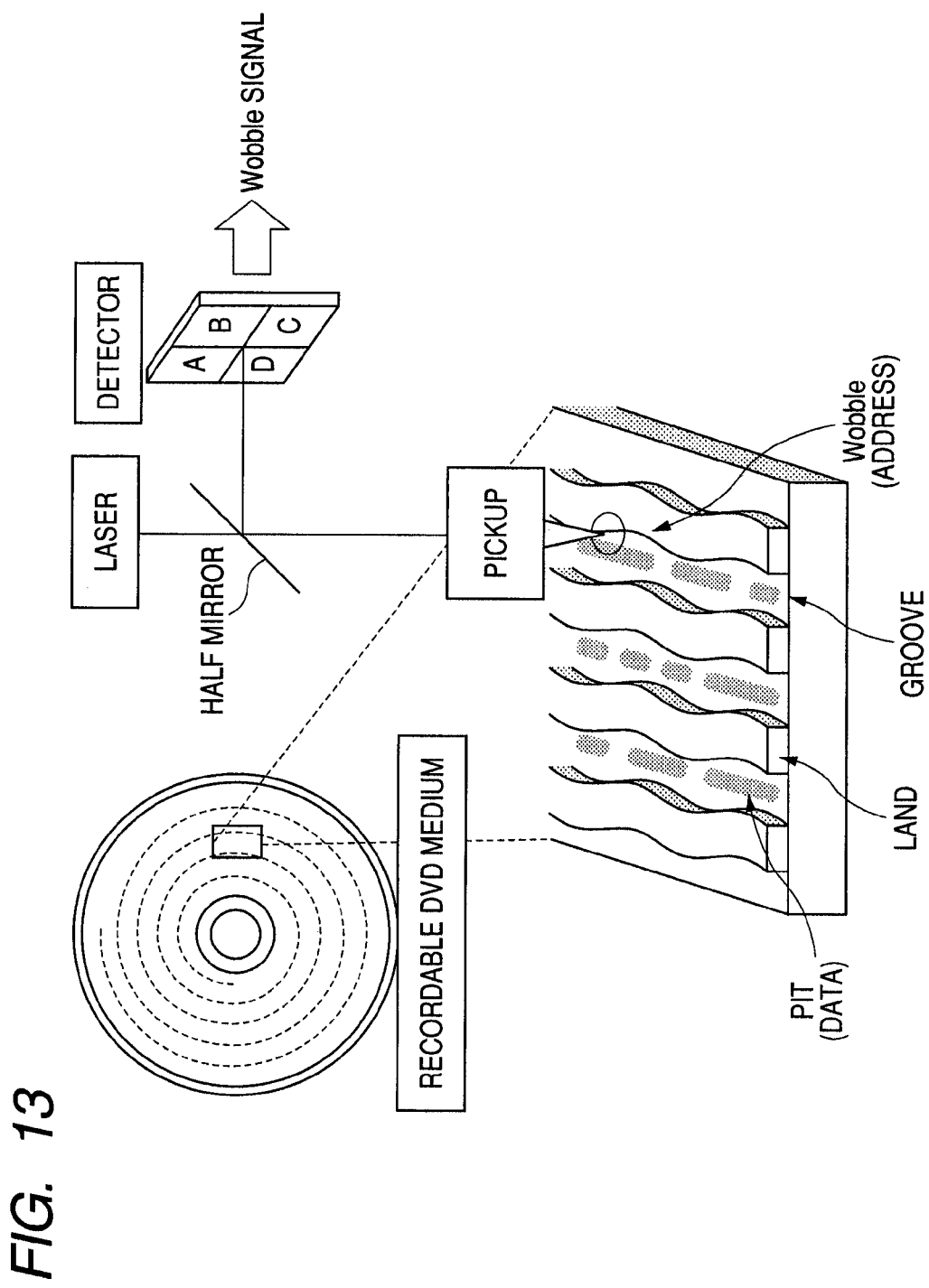
FIG. 13 is an explanatory diagram of wobble detection operation in the DVD recording/reproducing apparatus according to the invention.

FIG. 13 shows an explanatory diagram of wobble detection operation. The optical pickup includes a main sensor and two sets of sub-sensors. The main sensor uses four light receiving elements that are laid out in checkerboard fashion and detect a reflected ray of the main beam. The two sets of sub-sensors use two light receiving elements that detect reflected rays of two sub-beams. The main sensor outputs signals A through D. These signals are extracted through a half mirror and a detector and are then calculated to detect a WOBBLE signal.

Each medium has specific WOBBLE (oscillation) frequencies. The frequency is 818 kHz for a single-speed DVD+RW and 6.5 MHz for a eight-speed DVD+RW. The frequency is 141 kHz for a single-speed DVD-RW and 1.1 MHz for a eight-speed DVD-RW. The frequency is 157 kHz for a single-speed DVD-RAM and 1.3 MHz for a eight-speed DVD-RAM.

Figure 14:
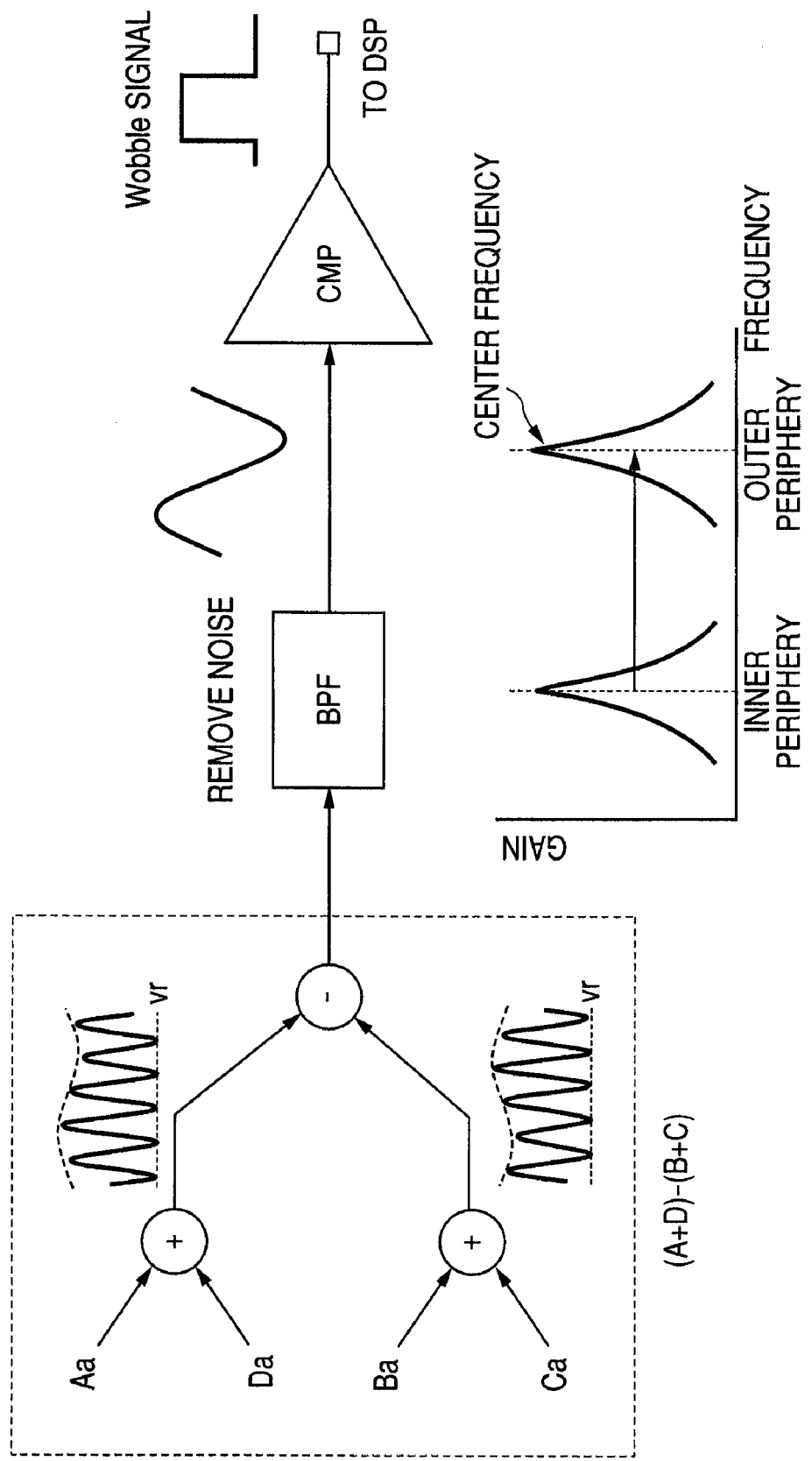
FIG. 14 is an explanatory diagram for wobble computation construction of the DVD recording/reproducing apparatus according to the invention.

FIG. 14 shows an explanatory diagram for wobble computation construction. A computing unit computes (Aa+Da)−(Ba+Ca). The computation assumes a signal level for (Aa+Da) and (Ba+Ca) to be a signal amplitude corresponding to the internal reference voltage vr described in FIG. 7. A computation output passes through a band-pass filter BPF to extract an envelope indicated by a dotted line. The envelope is input to a comparator CMP to generate a Wobble signal. FIG. 14 shows frequency characteristics of the band-pass filter BPF. The center frequency increases from an inner periphery to an outer periphery.

FIG. 15 shows a waveform diagram for describing power control by the FMD. The FMD outputs a differential signal that is internally converted into a singularizing signal. During reading, the FMD controls laser diode power using a continuous amplifier for feedback as indicated by (A). During writing, the FMD detects a level using an S/H (sample/hold) or bottom hold circuit as indicated by (B) and detects a read level using the S/H circuit as indicated by (C). The S/H circuit detects a power level during writing as indicated by (B) or (C). The power control requires up to 100 MHz of frequency band and uses the voltage division path (PS3).

Figure 16A:
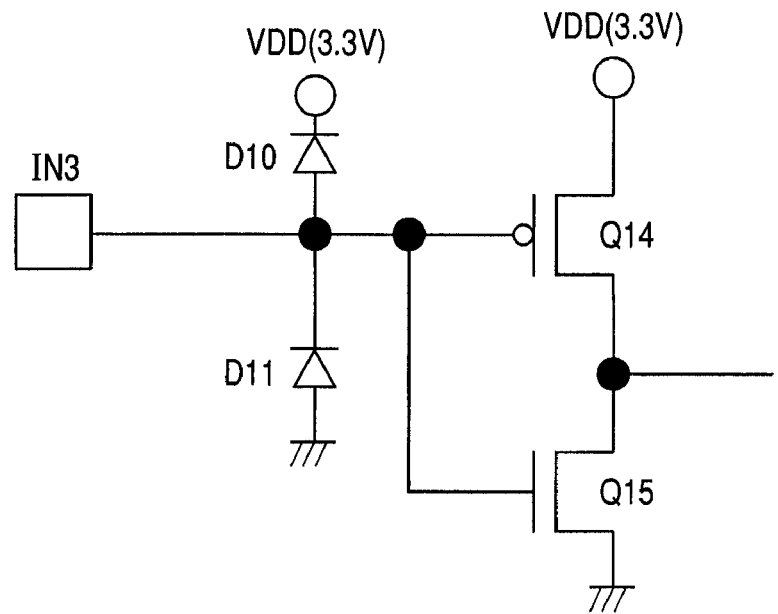
FIG. 16 is a circuit diagram showing an embodiment of another interface provided for a signal processing unit according to the invention.

FIG. 16 shows a circuit diagram for an embodiment of another interface provided for the signal processing unit according to the invention. The interface according to the embodiment is used for an apparatus that performs 3.3 V signal output. FIG. 16(A) diagrams an input circuit that receives a digital signal from the memory SDRAM. A CMOS inverter circuit includes a P-channel MOSFET Q14 and an N-channel MOSFET Q15 and receives an input signal supplied from an input terminal IN3. Diodes D10 and D11 constitute an electrostatic discharge protection circuit. The input terminal IN3 does not supply an input voltage that exceeds power supply voltage VDD (3.3 V). The diode D10 passes current from the input terminal IN3 to the power supply voltage VDD. The diode D11 passes current from the circuit's ground potential VSS to the input terminal IN3. The input circuit does not respond to the input signal and can discharge a high voltage due to static electricity.

Figure 16B:
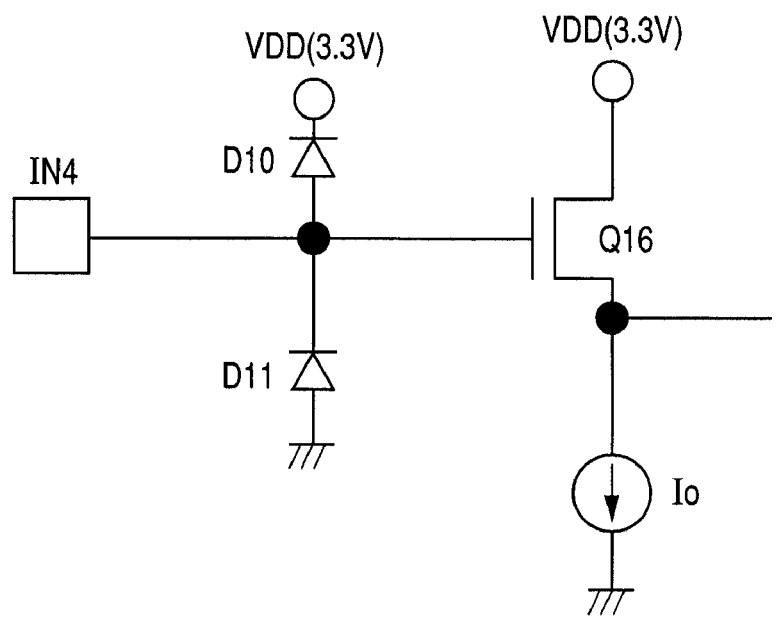

FIG. 16(B) shows an input circuit that receives an analog signal from another external apparatus. The input circuit receives an input signal supplied from an input terminal IN4 using an N-channel MOSFET Q16 and a source follower circuit that is provided for the source and includes a constant current source Io. Similarly to FIG. 16(A), diodes D10 and D11 form an electrostatic discharge protection circuit. The input terminal IN4 does not supply an input voltage that exceeds power supply voltage VDD (3.3 V). The diode D10 passes current from the input terminal IN4 to the power supply voltage VDD. The diode D11 passes current from the circuit's ground potential VSS to the input terminal IN4. The input circuit does not respond to the input signal and can discharge a high voltage due to static electricity.

The embodiment provides two interfaces for the semiconductor device constituting the signal processing unit as shown in FIG. 4. One interface is configured for the high-voltage input terminal as shown in FIG. 1, 2, 3, or 7. The other interface is configured for the signal voltage terminal equivalent to the operating voltage VDD or lower.

While there have been described specific preferred embodiments of the present invention made by the inventors, it is to be distinctly understood that the present invention is not limited thereto but may be otherwise variously embodied within the spirit and scope of the invention. For example, the resistors R1 through R6 may be not only polysilicon resistors, but also any resistor that can withstand a 5-V input voltage. While the one input terminal is provided with the clamp path (PS1) and the voltage division path (PS2), each of the input terminals may be correspondingly provided with the clamp path and the voltage division. The invention can be widely applied to not only the analog input circuit in the DVD recording/reproducing apparatus, but also a semiconductor device having an interface configured to directly receive an analog input signal higher than the operating voltage.

What is claimed is:
1. A semiconductor device comprising:
   a first input circuit unit,
   a second input circuit unit,
   wherein the first input circuit unit includes:
      a first external terminal supplied with a first analog input signal generated in a first external circuit operating on a first power supply voltage;
      a first electrostatic discharge protection circuit corresponding to the first analog input signal;
      a first voltage divider resistor for dividing the first analog input signal passing through the first electrostatic discharge protection circuit into a voltage corresponding to a second power supply voltage lower than the first power supply voltage;
      a first input circuit that operates on the second power supply voltage and receives the first analog input signal divided by the first voltage divider resistor to generate a first internal analog signal;
      a first unidirectional element for passing current from an input terminal of the first input circuit to the first power supply voltage;
      a second unidirectional element for passing current from a circuit ground potential to an input terminal of the first input circuit;
      a resistor transmitting the analog input signal passing through the first electrostatic discharge protection circuit;
      a second input circuit that operates on the first power supply voltage and receives the first analog input signal passing through the resistor to generate a second internal analog signal;
      a third unidirectional element for passing current from an input terminal of the second input circuit to the first power supply voltage; and
      a fourth unidirectional element for passing current from a circuit ground potential to an input terminal of the second input circuit;
      a second external terminal supplied with a second analog input signal formed in the first external circuit;
      a second electrostatic discharge protection circuit corresponding to the second analog input signal;
      a second voltage divider resistor for dividing the second analog input signal passing through the second electrostatic discharge protection circuit into a voltage corresponding to a third power supply voltage;
      a third input circuit that operates on the third power supply voltage and receives the second analog input signal divided by the second voltage divider resistor to generate a third internal analog signal;
      a fifth unidirectional element for passing current from an input terminal of the third input circuit to the first power supply voltage; and
      a fourth unidirectional element for passing current from a circuit ground potential to an input terminal of the third input circuit,
   wherein the second input circuit unit includes:
      a third external terminal supplied with a third analog input signal generated in a second external circuit operating on the second power supply voltage;
      a third electrostatic discharge protection circuit corresponding to the third analog input signal; and
      a fourth input circuit that operates on the second power supply voltage and receives the third analog input signal to generate a fourth internal analog signal.
2. The semiconductor device according to claim 1,
   wherein the first electrostatic discharge protection circuit includes:
      first serially connected diodes that are provided between the first external terminal and a power supply conductor supplied with the second power supply voltage and do not operate on a maximum value for the first analog signal; and
      a first diode that is provided between the first external terminal and a grounding conductor supplied with a circuit ground potential and passes current from a ground potential side to the first external input terminal,
   wherein the second electrostatic discharge protection circuit includes:
      second serially connected diodes that are provided between the second external terminal and the power supply conductor supplied with the second power supply voltage and do not operate on a maximum value for the second analog signal; and
      a second diode that is provided between the second external terminal and the grounding conductor supplied with the circuit around potential and passes current from the ground potential side to the second external input terminal,
   wherein the third electrostatic discharge protection circuit includes:

third serially connected diodes that are provided between the third external terminal and the power supply conductor supplied with the second power supply voltage and do not operate on a maximum value for the third analog signal; and a third diode that is provided between the third external terminal and the grounding conductor supplied with the circuit ground potential and passes current from the ground potential side to the third external input terminal.

3. The semiconductor device according to claim 2 further comprising:

a first MOSFET;
a second MOSFET;
a third MOSFET,
wherein
the first MOSFET is provided between one terminal of the first voltage divider resistor and the circuit ground potential and has its gate supplied with a first control signal for allowing the internal analog signal to be a specified voltage,
wherein the second MOSFET is provided between one terminal of the second voltage divider resistor and the circuit around potential and has its gate supplied with a second control signal for allowing the internal analog signal to be a specified voltage.

4. The semiconductor device according to claim 3, wherein the first voltage divider resistor, the second voltage divider resistor, and the resistor means use polysilicon resistors.

5. The semiconductor device according to claim 4, wherein the first, second, and third input circuits each include a source follower MOSFET with its gate connected to an input terminal and a power supply source connected to the source.

6. The semiconductor device according to claim 5, wherein the first external circuit is a DVD optical pickup circuit, and wherein the semiconductor device is mounted with a DVD signal processing circuit including a DVD analog front-end.

7. The semiconductor device according to claim 6, wherein an internal analog signal passing through the first input circuit is used for detecting a servo level, wobble, and LPP, wherein an internal analog signal passing through the second input circuit is used for detecting a servo phase difference, defect, unsuccessful recording, and RF signal, and wherein an internal analog signal passing through the third input circuit is used for power control.

8. The semiconductor device according to claim 7, wherein the semiconductor device includes:

a first chip mounted with the DVD signal processing circuit; and
a second chip mounted with the SDRAM, and
wherein signals corresponding to the first and second chips are connected with each other and are contained in one package.

9. The semiconductor device according to claim 1, wherein the first electrostatic discharge protection circuit includes:

first serially connected two NMOS transistors which is coupled between the first external terminal and the circuit ground potential, and gate of lower NMOS transistor is coupled with the circuit ground potential;
second serially connected NMOS transistors which is coupled between the second external terminal and the circuit ground potential, and gate of lower NMOS transistor is coupled with the circuit ground potential;
third serially connected NMOS transistors which is coupled between the third external terminal and the circuit ground potential, and gate of lower NMOS transistor is coupled with the circuit ground potential.

\* \* \* \* \*